United States Patent
Kim et al.

(10) Patent No.: US 8,253,486 B2
(45) Date of Patent: Aug. 28, 2012

(54) WIRELESS APPARATUS HAVING SHIELDING FUNCTION

(75) Inventors: Ki Joong Kim, Gyunggi-do (KR); Tae Joon Park, Daejeon (KR); Young Jean Song, Gyunggi-do (KR); Jun Goo Won, Gyunggi-do (KR); Youn Suk Kim, Gyunggi-do (KR)

(73) Assignee: Samsung Electro-Mechanics Co., Ltd., Gyunggi-do (KR)

( * ) Notice: Subject to any disclaimer, the term of this patent is extended or adjusted under 35 U.S.C. 154(b) by 175 days.

(21) Appl. No.: 12/790,327

(22) Filed: May 28, 2010

(65) Prior Publication Data
US 2011/0121898 A1   May 26, 2011

(30) Foreign Application Priority Data
Nov. 24, 2009   (KR) .................. 10-2009-0114097

(51) Int. Cl.
*H03F 1/00* (2006.01)
(52) U.S. Cl. .................. 330/68; 330/302; 330/195
(58) Field of Classification Search .................. 330/68, 330/302, 195
See application file for complete search history.

(56) References Cited

U.S. PATENT DOCUMENTS

| | | | |
|---|---|---|---|
| 3,448,398 A * | 6/1969 | Gillette et al. | 330/69 |
| 5,801,597 A | 9/1998 | Carter et al. | |
| 5,831,476 A * | 11/1998 | Buer et al. | 330/2 |
| 6,577,199 B2 * | 6/2003 | Dent | 330/302 |
| 7,259,625 B2 * | 8/2007 | Sanderson | 330/253 |
| 7,348,845 B2 * | 3/2008 | Giovannotto | 330/195 |
| 2003/0117220 A1 * | 6/2003 | Kuriyama et al. | 330/302 |
| 2007/0262418 A1 | 11/2007 | Degani et al. | |

FOREIGN PATENT DOCUMENTS

| | | |
|---|---|---|
| GB | 2426632 B | 1/2009 |
| JP | 10-261889 A | 9/1998 |
| JP | 2006-333134 A | 12/2006 |
| KR | 10-2005-0031228 A | 4/2005 |

OTHER PUBLICATIONS

Korean Office Action for Application No. 10-2009-0114097 dated May 2, 2011.

* cited by examiner

*Primary Examiner* — Patricia Nguyen
(74) *Attorney, Agent, or Firm* — Lowe, Hauptman, Ham & Berner, LLP

(57) ABSTRACT

There is provided a wireless apparatus having a shielding function for shielding signal interference between driving power from a power amplifier and a conductive wire of a coupler. The wireless apparatus having a shielding function, includes an amplifying unit receiving preset driving power and amplifying a radio frequency (RF) input signal according to a preset gain, an impedance matching unit including at least one coil, receiving the driving power from the amplifying unit, and matching the impedance of a path of a signal, amplified from the amplifying unit, through the coil, and a shielding unit eliminating signal interference between the coil and a transmission path of the driving power from the amplifying unit.

6 Claims, 3 Drawing Sheets

WIRELESS APPARATUS HAVING SHIELDING FUNCTION

CROSS-REFERENCE TO RELATED APPLICATIONS

This application claims the priority of Korean Patent Application No. 10-2009-114097 filed on Nov. 24, 2009, in the Korean Intellectual Property Office, the disclosure of which is incorporated herein by reference.

BACKGROUND OF THE INVENTION

1. Field of the Invention

The present invention relates to a wireless apparatus, and more particularly, to a wireless apparatus having a shielding function for shielding signal interference between driving power from a power amplifier and a conductive wire of a coupler.

2. Description of the Related Art

In general, electronic devices, employing wireless communications circuits, are in wide use since they are easy to use and carry and are advantageous in terms of installation and maintenance.

Representative examples of electronic devices employing wireless communications circuits include mobile communications terminals, personal digital assistants (PDA) and the like.

Such wireless electronic communications devices use a transceiver circuit for transmitting and receiving a signal that contains information.

The transceiver circuit includes a power amplifier that amplifies the power of a received signal or a signal, which is to be transmitted.

The output signal of the power amplifier is transmitted to an antenna or a receiving circuit after experiencing power coupling and impedance matching. The harmonic level of the output signal from the power amplifier is required to be at least −10 dB or less.

The power amplifier and a power coupling circuit, the essential components of the transceiver circuit, are integrated onto a single board. In this case, the power amplifier may be formed by using a complementary metal oxide semiconductor (CMOS) process, and the power coupling circuit may be formed by using an integrated passive device (IPD) process.

In the above-described configuration, the power line of an external driving power source is installed above a power coupler. For this reason, the harmonic levels, and the second-harmonic levels in particular, are deteriorated, which leads to failure to meet consumer demand.

SUMMARY OF THE INVENTION

An aspect of the present invention provides a wireless apparatus having a shielding function for shielding signal interference between driving power from a power amplifier and the conductive wire of a coupler.

According to an aspect of the present invention, there is provided a wireless apparatus having a shielding function, the wireless apparatus including: an amplifying unit receiving preset driving power and amplifying a radio frequency (RF) input signal according to a preset gain; an impedance matching unit including at least one coil, receiving the driving power from the amplifying unit, and matching the impedance of a path of a signal, amplified from the amplifying unit, through the coil; and a shielding unit eliminating signal interference between the coil and a transmission path of the driving power from the amplifying unit.

The amplifying unit, the impedance matching unit and the shielding unit may be integrated onto a single circuit board.

The impedance matching unit may include: a first band transformer matching the impedance of a path of a signal within a preset first band among signals amplified from the amplifying unit; and a second band transformer matching the impedance of a path of a signal within a preset second band, being different from the first band, among signals amplified from the amplifying unit.

The transmission path of the driving power may extend from the amplifying unit and pass between the first band transformer and the second band transformer, such that the driving power is transmitted to the first band transformer and the second band transformer.

The shielding unit may be disposed above a part of the transmission path of the driving power, located between the first band transformer and the second band transformer, and shield the part of the transmission path between the first band transformer and the second band transformer to thereby eliminate signal interference between the transmission path and the coils of the first band transformer and the second band transformer.

The shielding unit may be disposed above a part of the coil of each of the first band and second band transformers, the part being located adjacent to the transmission path, and shield the part of the coil adjacent to the transmission path to thereby eliminate signal interference between the transmission path and the coil of each of the first band and second band transformers.

The wireless input signal may be a balanced signal.

An output signal from the impedance matching unit is an unbalanced signal.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
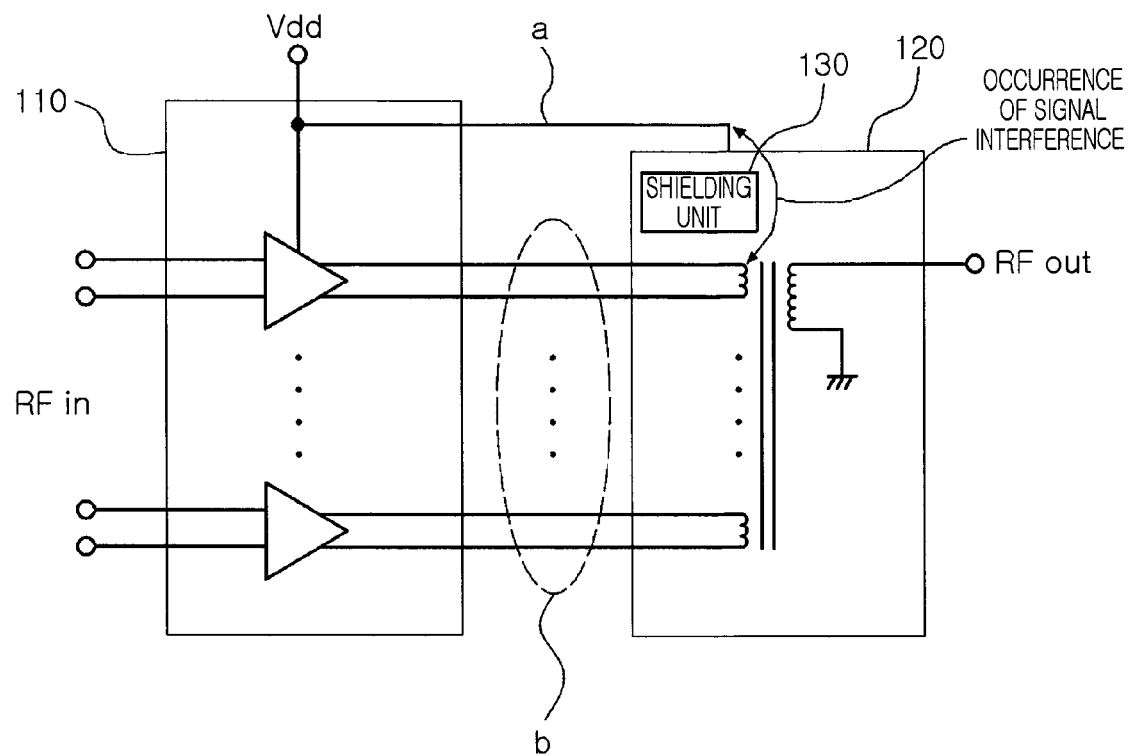
FIG. 1 is a schematic configuration view according to an exemplary embodiment of the present invention.

Exemplary embodiments of the present invention will now be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity. Like reference numerals in the drawings denote like elements, and thus their description will be omitted.

FIG. 1 is a schematic configuration view according to an exemplary embodiment of the present invention.

Referring to FIG. 1, a wireless apparatus 100, according to this exemplary embodiment of the present invention, may include an amplifying unit 110, an impedance matching unit 120 and a shielding unit 130.

The amplifying unit 110 may include a plurality of amplifiers that amplify respective radio frequency (RF) input signals "RF in", which are balanced signals. The plurality of amplifiers may be operated by receiving driving power Vdd.

The impedance matching unit 120 may be operated by receiving the driving power Vdd from the amplifying unit 110. The impedance matching unit 120 may match the impedance of the path of a signal amplified from the amplifying unit 110.

In this case, the impedance matching unit 120 may include a coil for impedance matching. The coil may include a plurality of primary coils respectively corresponding to a plurality of amplifiers, and a secondary coil electromagnetically coupled with the plurality of primary coils and performing impedance matching and signal coupling. The plurality of primary coils and the secondary coil may be formed as at least one transformer.

A transmission path for driving power Vdd, sent from the amplifying unit 110 to the impedance matching unit 120, may cause signal interference with the coil of the impedance matching unit 120. Therefore, the wireless apparatus 100, according to this exemplary embodiment of the present invention, may include the shielding unit 130 that eliminates signal interference occurring between the transmission path for driving power Vdd and the coil of the impedance matching unit 120.

Figure 2:
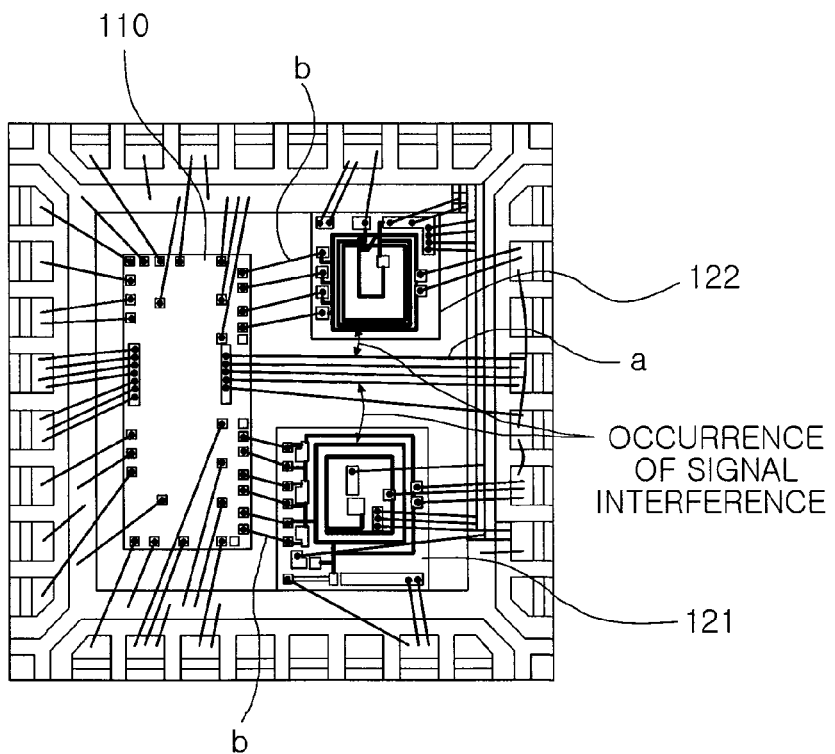
FIG. 2 is a layout illustrating a part of a wireless apparatus which is integrated onto a board according to an exemplary embodiment of the present invention.

FIG. 2 is a layout illustrating a part of the wireless apparatus integrated onto a board according to an exemplary embodiment of the present invention.

Referring to FIG. 2 as well as FIG. 1, the wireless apparatus 100, according to this exemplary embodiment, may be integrated onto a single board.

The amplifying unit 110 may be formed on the single board by using a complementary metal oxide semiconductor (CMOS) process, and the impedance matching unit 120 may be formed on the board by using an integrated passive device (IPD) process. The amplifying unit 110 may be disposed on one side of the board, and the impedance matching unit 120 may be disposed on the board at a predetermined distance from the amplifying unit 110.

The impedance matching unit 120 may include a first band transformer 121 and a second band transformer 122 according to the frequency range of an RF input signal input to the amplifying unit 110.

The first band transformer 121 may match the impedance of the path of a signal within a first band, covering a preset frequency range, among signals from the amplifying unit 110. The second band transformer 122 may match the impedance of the path of a signal within a second band, covering a different frequency range from the first band, among signals from the amplifying unit 110.

Signals, amplified from the amplifying unit 110, are transmitted through paths "b" to the first band transformer 121 or the second band transformer 122 corresponding to the frequencies of the signals. The driving power Vdd is transmitted from the amplifying unit 110 to the first band transformer 121 or the second band transformer 122 through transmission paths "a".

The transmission paths "a" for the driving power Vdd may be formed between the first band transformer 121 and the second band transformer 122 in due consideration of transmission efficiency.

The first band and the second band transformers 121 and 122 each include a coil to which a signal is transmitted, in order to perform their own operation. Since the coil is located near the transmission paths "a" of the driving power Vdd, signal interference may occur.

Figure 3A:
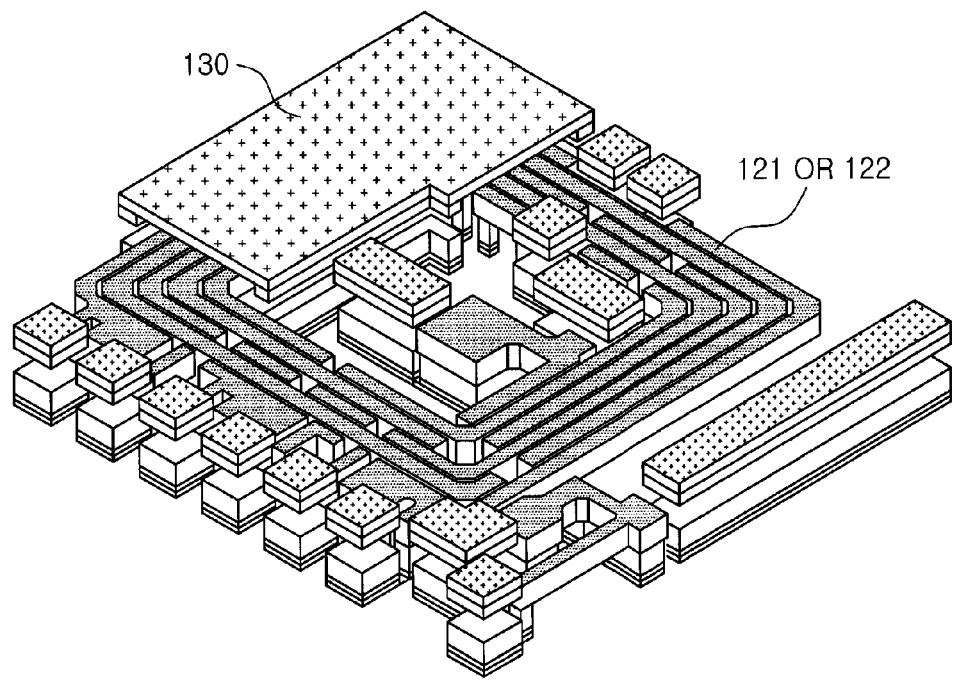
FIGS. 3A and 3B are layouts illustrating the way in which a shielding unit of the wireless apparatus is disposed on a board, according to exemplary embodiments of the present invention.
Figure 3B:
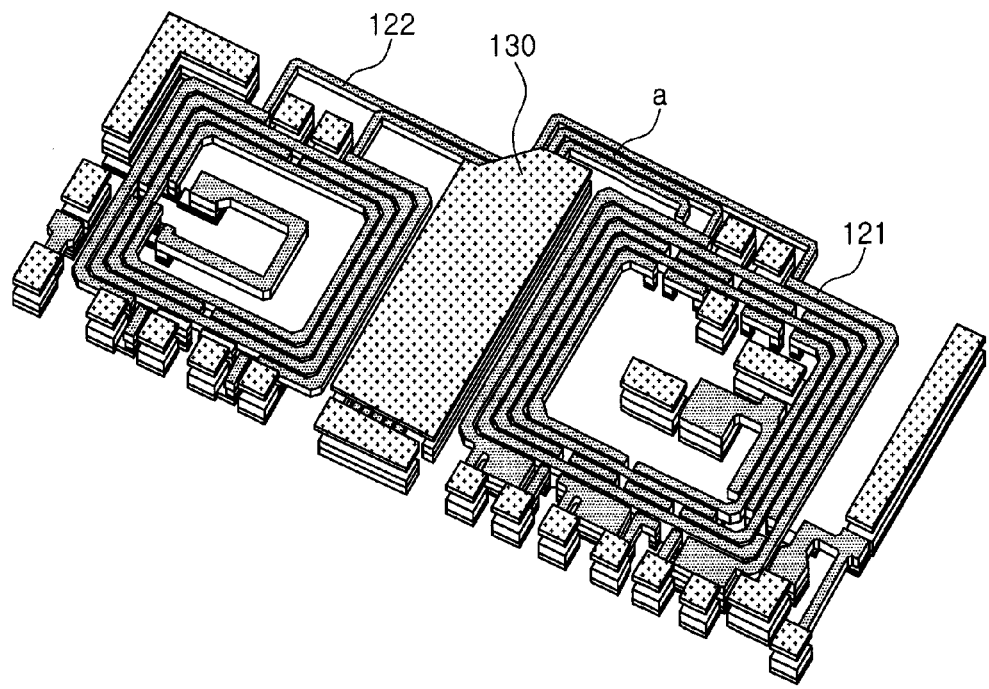

FIGS. 3A and 3B are layouts illustrating that the way in which the shielding unit of the wireless apparatus is disposed on a board according to exemplary embodiments of the present invention.

As shown in FIG. 3A, the shielding unit 130, according to an exemplary embodiment, may eliminate signal interference by shielding a part of the coil of the first band or second band transformer 121 or 122, adjacent to the transmission paths "a" of the driving power Vdd, without electrically contacting the coil.

As shown in FIG. 3B, the shielding unit 130, according to another exemplary embodiment, may be spaced apart from the transmission path "a" of driving power Vdd in order to eliminate signal interference that may occur between the transmission path "a" of the driving power Vdd and the coils of the first band transformer 121 and the second band transformer 122.

That is, the shielding unit 130 may eliminate signal interference by shielding a part of the transmission paths "a" adjacent to the coils of the first band and the second band transformers 121 and 122 without electrically contacting the transmission paths "a" of the driving power Vdd. Thus, the shielding unit 130 may be formed of a metallic material and have a predetermined area.

Figure 4A:
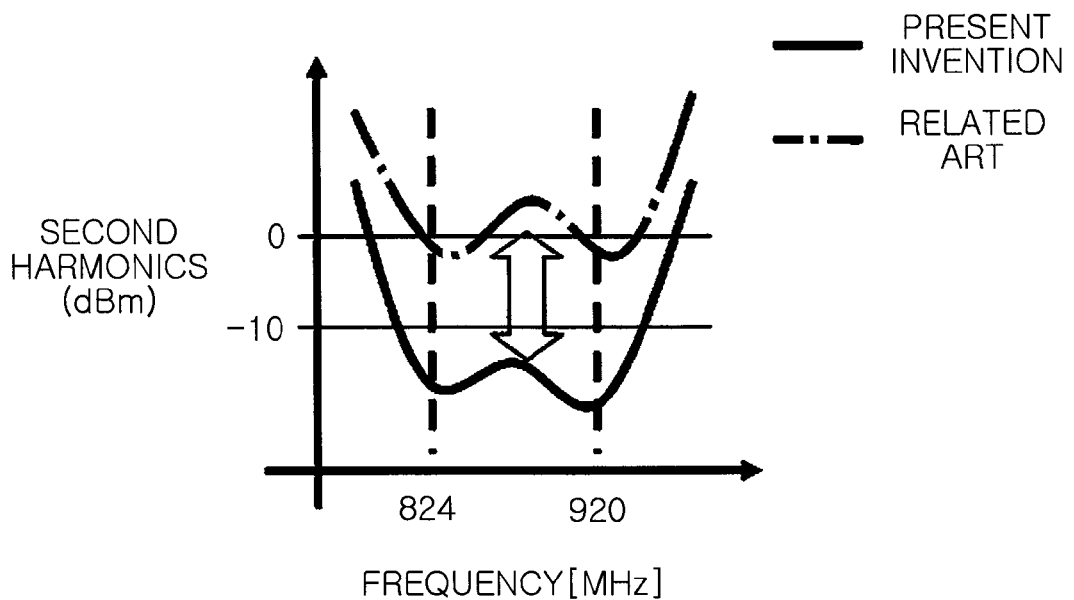
FIGS. 4A and 4B are graphs showing the signal characteristics of a wireless apparatus according to an exemplary embodiment of the present invention.
Figure 4B:
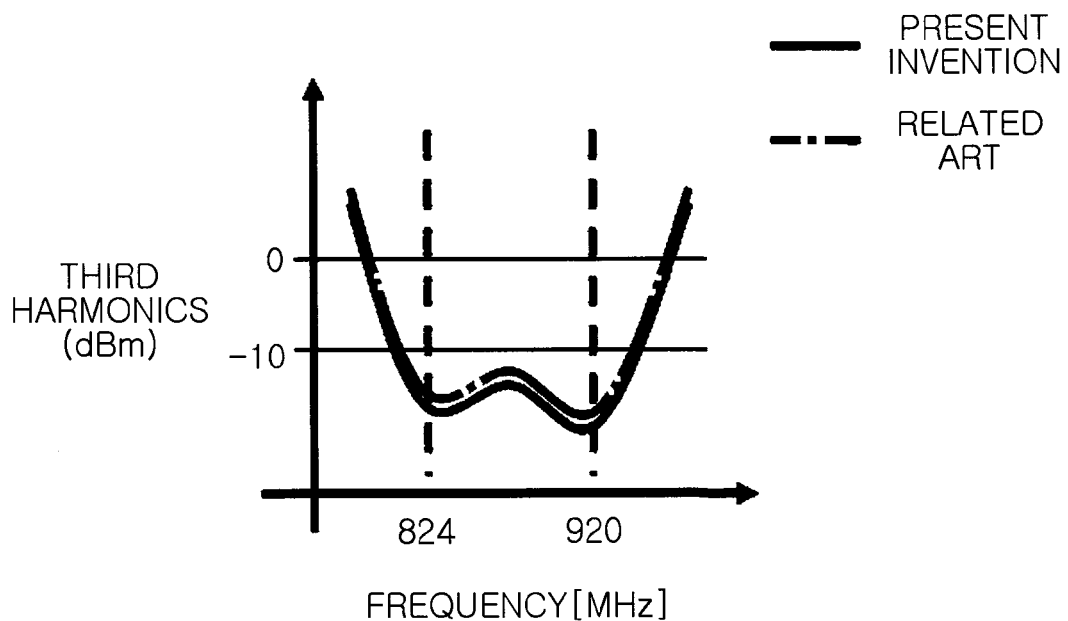

FIGS. 4A and 4B are graphs illustrating the signal characteristics of the wireless apparatus according to the present invention.

As shown in FIG. 4A, the shielding unit, employed in the wireless apparatus according to the present invention, eliminates signal interference to thereby improve the second harmonic level to at least −10 dB or less, while, as shown in FIG. 4B, maintaining the same level of third harmonics as that of the related art within a specific frequency band.

As described above, according to the present invention, signal interference is eliminated by shielding a part of driving power from the power amplifier formed on a board or the conductive wire of a coupler, so that the second-harmonic level desired by consumers can be provided.

As set forth above, according to exemplary embodiments of the invention, since signal interference is shielded between driving power from a power amplifier and the conductive wire of a coupler, desired second harmonic characteristics can be achieved.

While the present invention has been shown and described in connection with the exemplary embodiments, it will be apparent to those skilled in the art that modifications and variations can be made without departing from the spirit and scope of the invention as defined by the appended claims.

What is claimed is:

1. A wireless apparatus having a shielding function, the wireless apparatus comprising:
    an amplifying unit configured to receive driving power and amplify a radio frequency (RF) input signal according to a preset gain;
    an impedance matching unit including at least one coil and configured to receive the driving power from the amplifying unit and to match an impedance of a path of a signal, amplified from the amplifying unit, through the coil; and a shielding unit configured to eliminate signal interference between the coil and a transmission path of the driving power from the amplifying unit, wherein the amplifying unit, the impedance matching unit and the shielding unit are integrated onto a single circuit board, and the impedance matching unit comprises:
- a first band transformer configured to match the impedance of a path of a signal within a first band among amplified signals from the amplifying unit; and
- a second band transformer configured to match the impedance of a path of a signal within a second band, being different from the first band, among the amplified signals from the amplifying unit.

2. The wireless apparatus of claim 1, wherein the transmission path of the driving power extends from the amplifying unit and passes between the first band transformer and the second band transformer, such that the driving power is transmitted to the first band transformer and the second band transformer.

3. The wireless apparatus of claim 2, wherein the shielding unit is disposed above a part of the transmission path of the driving power, located between the first band transformer and the second band transformer, and is configured to shield the part of the transmission path between the first band transformer and the second band transformer to thereby eliminate signal interference between the transmission path and coils of the first band transformer and the second band transformer.

4. The wireless apparatus of claim 2, wherein the shielding unit is disposed above a part of a coil of each of the first band and second band transformers, located adjacent to the transmission path, and is configured to shield the part of the coil adjacent to the transmission path to thereby eliminate signal interference between the transmission path and the coil of each of the first band and second band transformers.

5. The wireless apparatus of claim 1, wherein the RF input signal is a balanced signal.

6. The wireless apparatus of claim 5, wherein the impedance matching unit is configured to output an unbalanced signal.

* * * * *